United States Patent
Matsui (10) Patent No.: US 8,155,365 B2
(45) Date of Patent: Apr. 10, 2012

(54) GOOSENECK MICROPHONE WITH COVERING MEMBER IN OUTPUT MODULE

(75) Inventor: Noriko Matsui, Tokyo (JP)

(73) Assignee: Kabushiki Kaisha Audio Technica, Tokyo (JP)

( * ) Notice: Subject to any disclaimer, the term of this patent is extended or adjusted under 35 U.S.C. 154(b) by 1009 days.

(21) Appl. No.: 12/149,629

(22) Filed: May 6, 2008

(65) Prior Publication Data

US 2008/0279408 A1    Nov. 13, 2008

(30) Foreign Application Priority Data

May 8, 2007   (JP) ................................. 2007-123163

(51) Int. Cl.
 *H04R 9/08*   (2006.01)
(52) U.S. Cl. .................... 381/363; 381/361; 381/189
(58) Field of Classification Search .................. 381/355, 381/361, 362, 363, 364, 365, 366, 368, 189
See application file for complete search history.

(56) References Cited

U.S. PATENT DOCUMENTS

| 5,615,273 | A * | 3/1997 | Lucey et al. ................. 381/361 |
| 2006/0013426 | A1 * | 1/2006 | Akino ........................... 381/361 |
| 2006/0013428 | A1 * | 1/2006 | Akino ........................... 381/369 |

FOREIGN PATENT DOCUMENTS

| JP | S50-020674 | 6/1975 |
| JP | S51-027124 | 2/1976 |
| JP | S56-121296 | 9/1981 |
| JP | S63-157990 | 10/1988 |
| JP | H02-133089 | 11/1990 |
| JP | 2001-266715 | 9/2001 |
| JP | 2002-134962 | 5/2002 |
| JP | 2003-229034 | 8/2003 |
| JP | 2005-217021 | 8/2005 |
| JP | 2005-221463 | 8/2005 |
| JP | 2006-019854 | 1/2006 |
| JP | 2007-036524 | 2/2007 |

* cited by examiner

*Primary Examiner* — Victor A Mandala
*Assistant Examiner* — Scott Stowe
(74) *Attorney, Agent, or Firm* — Manabu Kanesaka (57) ABSTRACT

In a gooseneck microphone in which a support pipe is capable of extending and contracting, and accordingly a microphone cord extension/contraction part is provided in an output module section, the microphone cord soldered part on a circuit board is prevented from being rubbed by the microphone cord extension/contraction part. The gooseneck microphone includes the support pipe that includes a telescopic pipe and supports a condenser microphone unit on the upper end side thereof, the output module section 30 that is connected to the lower end of the support pipe via a connector 23 at the upper end of a shield case incorporating the circuit board 32, and a microphone cord 40 one end of which is connected to the condenser microphone unit and the other end 40b of which is pulled out into the output module section 30 through the support pipe and a connector 23 and is soldered to the circuit board 32, and a cord extension/contraction part 41 that extends and contracts along with the extension and contraction of the support pipe is provided on the other end 40b side of the microphone cord in the output module section 30. In the gooseneck microphone, the circuit board 32 is provided with a covering member 50 for covering at least a soldered part S of the microphone cord 40.

6 Claims, 5 Drawing Sheets

GOOSENECK MICROPHONE WITH COVERING MEMBER IN OUTPUT MODULE

TECHNICAL FIELD

The present invention relates to a gooseneck microphone in which a support pipe for supporting a microphone unit is capable of extending and contracting (length-adjustable). More particularly, it relates to a technique for handling the wiring of a microphone cord that extends and contracts along with the extension and contraction of the support pipe.

BACKGROUND ART

A gooseneck microphone is used mainly in a state of being erected on a table in conference facilities. To easily direct the microphone at the speaker's mouth, a bendable support pipe (gooseneck) is provided as the support member of microphone.

Usually, the support pipe consists of a combination of a freely bendable pipe having self-shape holding properties, what is called a flexible pipe, and a telescopic pipe, and the position and direction of the microphone can be adjusted freely according to the height of speaker.

Figure 5A:
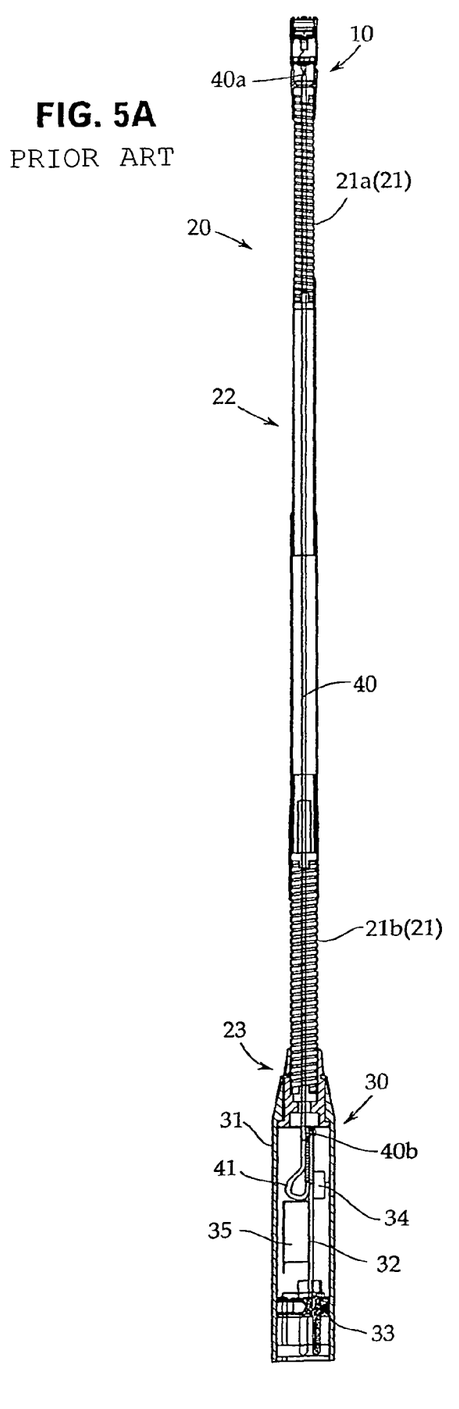
FIG. 5A is a sectional view of a conventional adjustable gooseneck microphone, showing a state in which the support pipe thereof is extended to the maximum length.
Figure 5B:
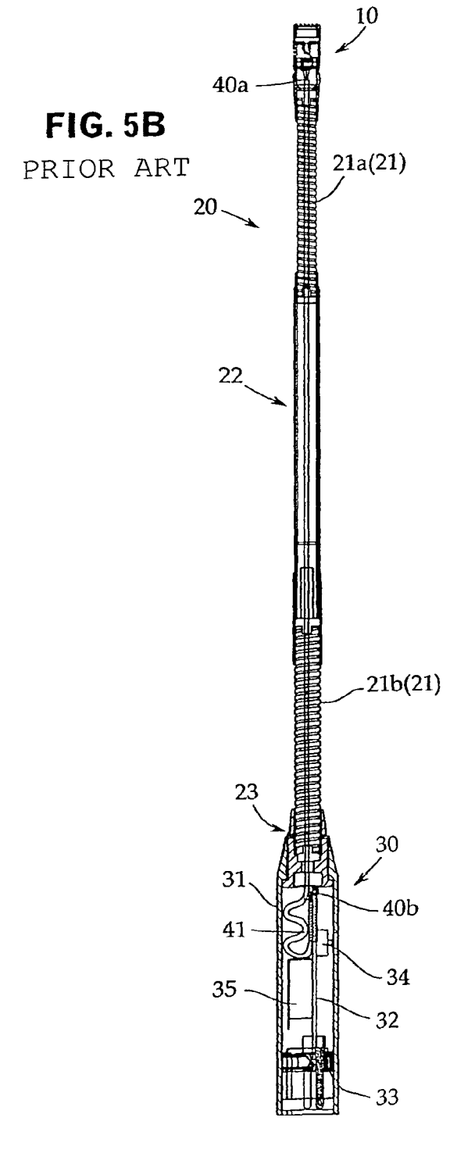
FIG. 5B is a sectional view thereof, showing a state in which the support pipe thereof is contracted to the minimum length.
Figure 6:
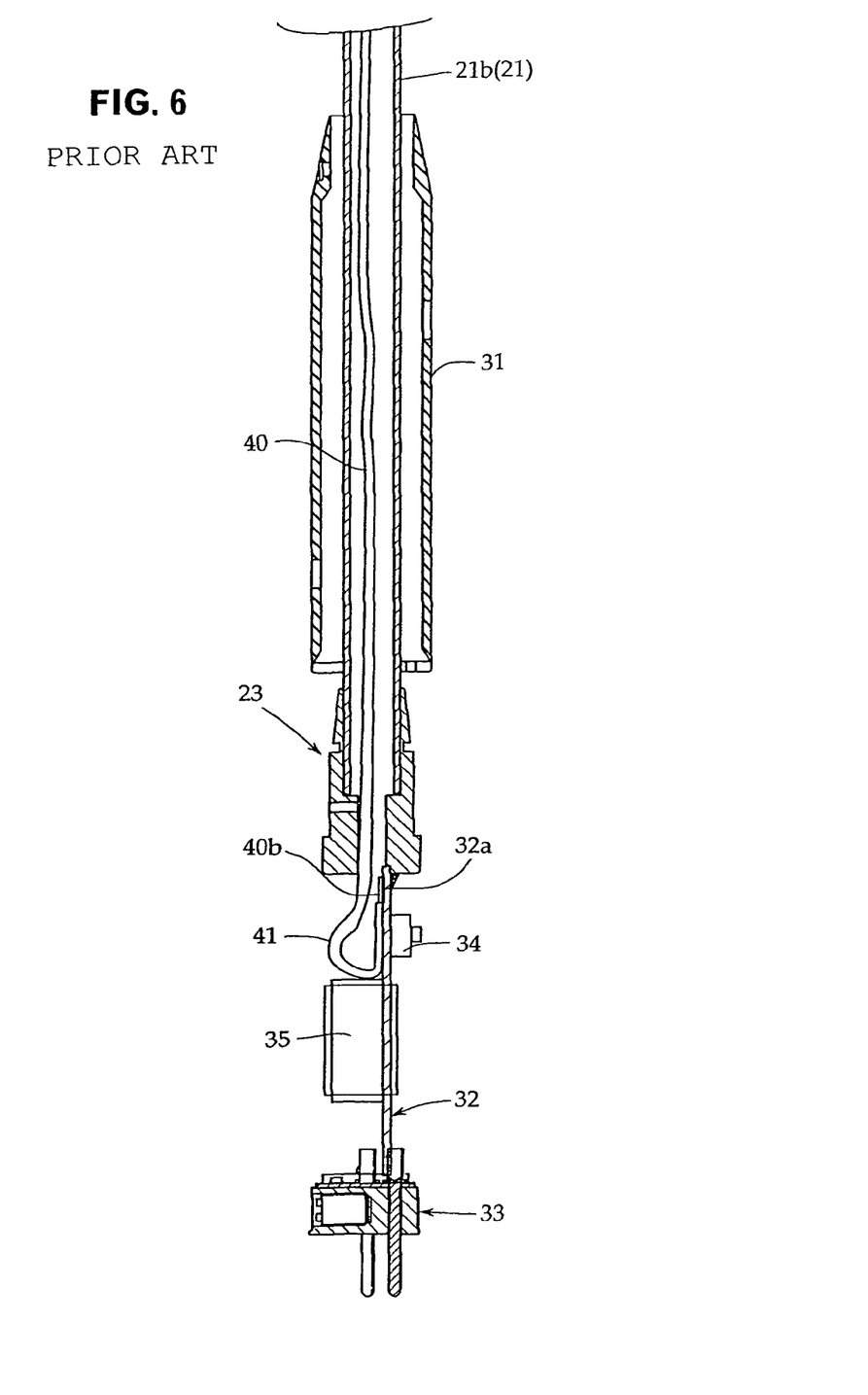
FIG. 6 is an enlarged sectional view showing a state in which a conventional microphone cord is connected to the circuit board of an output module section.

A gooseneck microphone of this type having the length-adjustable support pipe is called an adjustable gooseneck microphone. The configuration of the adjustable gooseneck microphone is explained with reference to FIGS. 5A and 5B and FIG. 6. FIG. 5A is a sectional view of the adjustable gooseneck microphone, showing a state in which the support pipe thereof is extended to the maximum length, and FIG. 5B is a sectional view thereof, showing a state in which the support pipe thereof is contracted to the minimum length. FIG. 6 is an enlarged sectional view showing a state in which the microphone cord of the adjustable gooseneck microphone shown in FIG. 5 is connected to the circuit board of an output module section.

Referring to FIGS. 5A and 5B, in the gooseneck microphone, as in a tie clip microphone, a condenser microphone unit 10 and an output module section 30 are configured so as to be separated from each other to make the presence of microphone inconspicuous. The condenser microphone unit 10 is supported at the upper end of a support pipe 20, and the output module section 30 is connected to the lower end of the support pipe 20 via a connector 23.

The condenser microphone unit 10 is provided with a cartridge case (shield case) formed of, for example, aluminum. Although not shown, the cartridge case accommodates a condenser unit including a diaphragm and a backplate and an impedance converter for generating audio signals. Usually, a field effect transistor (FET) is used as the impedance converter.

Since the gooseneck microphone is of an adjustable gooseneck type, the support pipe 20 includes a freely bendable flexible pipe 21 and a telescopic pipe 22 consisting of a metallic pipe for adjusting the length.

In this example, the flexible pipe 21 is separated into a first flexible pipe 21a on the distal end side and a second flexible pipe 21b on the proximal end side, and the telescopic pipe 22 is interposed coaxially therebetween. In some cases, the lower end side of the support pipe 20 consists of the telescopic pipe, and the upper end side thereof consists of the flexible pipe.

The output module section 30 is provided with a cylindrical shield case 31 formed of, for example, a brass alloy. The shield case 31 accommodates a circuit board 32 and an output connector 33. The output module section is also called a power module section.

On the circuit board 32, an audio output circuit (not shown) including a low-cut filter circuit and an amplifier circuit, which are necessary for the function of microphone, is provided. Explaining a portion shown in the figures, electrical parts such as a microphone switch 34 and a feeding transformer 35 are mounted.

As the output connector 33, a three-pin output connector specified in EIAJ-RC5236 "Audio latch lock round type connector" is usually used. Specifically, the output connector 33 has No. 1 pin for grounding, No. 2 pin used as the hot side of signal, and No. 3 pin used as the cold side of signal, and is connected to a phantom power source via a balanced shielded cable, not shown.

The condenser microphone unit 10 and the output module section 30 are connected electrically to each other via a microphone cord 40 inserted in the support pipe 20. As the microphone cord 40, a two-core shielded cable is used which contains a power wire for supplying power to the condenser microphone unit 10, a signal wire for supplying audio signals generated from the impedance converter to the audio output circuit of the circuit board 32, and a shielding wire for electrostatically shielding the power wire and the signal wire to provide an electrical ground (these wires are not shown in the figures).

For the adjustable gooseneck microphone, when the length of the support pipe 20 is adjusted by extending and contracting the telescopic pipe 22, the microphone cord 40 must also be extended and contracted along with the extension and contraction of the telescopic pipe 22. Therefore, a cord extension/contraction part 41 for the microphone cord 40 is provided in the output module section 30. Conventionally, the cord extension/contraction part 41 has been formed as described below (for example, refer to Japanese Patent Application Publication No. 2006-19854).

As shown in FIG. 5, the microphone cord 40 is inserted in the support pipe 20, and one end 40a thereof is connected to the condenser microphone unit 10. The other end 40b of the microphone cord 40 is, as shown in FIG. 6, pulled out into the output module section 30 after being caused to pass through the connector 23, and is soldered to an electrode terminal 32a formed on one surface of the circuit board 32.

To reduce the occurrence of noise caused by extraneous electromagnetic waves by shortening the wiring length of the microphone cord 40 in the output module section 30, the electrode terminal 32a is formed at one end close to the connector 23 side of the circuit board 32. Also, in this example, one end side of the circuit board 32 is fixed to the connector 23, for example, by soldering or screwing.

In this configuration, to provide the cord extension/contraction part 41, as shown in FIG. 6, the circuit board 32 is exposed in advance by shifting the shield case 31 to the support pipe 20 side, and as shown in FIG. 5A, the microphone cord 40 is pulled out onto the circuit board 32 in the state in which the support pipe 20 is extended to the maximum length, and is cut to an appropriate length.

Precautionary measures are taken to prevent excessive stress (force in the direction such as to break the soldered part) from being applied to the soldered part especially when the microphone cord 40 is contracted. Also, the other end 40b side of the microphone cord 40 is folded through 180 degrees and is soldered to the electrode terminal 32a so that initial creases are formed easily.

Thereafter, the shield case 31 is returned to the original position to cover the circuit board 32. The shield case 31 is screwed to the connector 23 with threads, not shown, and the output connector 33 is screwed to the shield case 31 with threads, not shown.

Thereby, as shown in FIG. 5B, when the support pipe 20 is contracted, a cord excess part corresponding to the contracted part is stored in the output module section 30 as the cord extension/contraction part 41 while being curled into a zigzag shape.

According to the above-described conventional example, since the other end 40b side of the microphone cord 40 is folded through 180 degrees and is soldered to the electrode terminal 32a of the circuit board 32 in the state in which the microphone cord 40 is extended to the maximum length, when the support pipe 20 is contracted thereafter, the other end side of the microphone cord 40 is stored in the output module section 30 while being folded into a zigzag shape. This presents problems as described below.

When the microphone cord 40 is pulled out of and brought back into the output module section 30 along with the extension and contraction of the support pipe 20, the soldered part of the electrode terminal 32a is rubbed by the microphone cord 40 each time, so that the soldered part may be broken to cause disconnection.

Also, since the microphone cord 40 tends to go straight through a narrow passage in the connector 23, it tends to curl in the direction substantially perpendicular to the board surface of the circuit board 32 (longitudinal direction) in the output module section 30.

That is to say, the microphone cord 40 is folded into a zigzag shape in a narrow space between the circuit board 32 and the inner surface of the shield case 31, so that the movement thereof becomes stiff. Therefore, the support pipe 20 is not extended and contracted smoothly. Also, excessive stress is unfavorably applied to the circuit board 32. In particular, this phenomenon appears more remarkably as the extension/contraction length of the support pipe 20 increases.

Accordingly, an object of the present invention is to provide an adjustable gooseneck microphone in which the support pipe can be extended and contracted and accordingly the extension/contraction part of microphone cord is provided in the output module section, wherein the soldered part in which the microphone cord is soldered to the circuit board is not broken by the repeated extension and contraction of microphone cord. Also, another object of the present invention is to provide an adjustable gooseneck microphone in which the movement of the extension/contraction part of microphone cord in the output module section is smooth.

SUMMARY OF THE INVENTION

To achieve the above objects, the present invention provides a gooseneck microphone including a support pipe which includes a telescopic pipe and a bendable flexible pipe and supports a condenser microphone unit on the upper end side thereof; an output module section which has a cylindrical shield case incorporating a circuit board including an audio output circuit and is connected with the lower end of the support pipe via a connector at the upper end thereof; and a microphone cord which is inserted in the support pipe, one end thereof being connected to the condenser microphone unit and the other end thereof being pulled out into the output module section through the connector and being soldered to a predetermined electrode terminal existing on one surface of the circuit board, a cord extension/contraction part which extends and contracts along with the extension and contraction of the support pipe being provided on the other end side of the microphone cord in the output module section, wherein the circuit board is provided with a covering member which covers at least a soldered part in which the microphone cord is soldered to the electrode terminal.

According to this configuration, disconnection caused by the breakage of the soldered part can be prevented surely.

According to a preferred mode of the present invention, as the covering member, a cover film formed of a low-friction synthetic resin material.

According to this configuration, the covering member can be attached easily to the circuit board, and due to low friction, the movement of the cord extension/contraction part can be made smoother.

Also, according to a preferred mode of the present invention, the electrode terminal is arranged on one end side on the connector side of the circuit board; a part on the other end side of the microphone cord is a parallel-to-board part which extends to the opposite side to the connector through a predetermined distance from the soldered part in which the other end is soldered to the electrode terminal toward the other end side of the circuit board along one surface of the circuit board, and the remaining part of the microphone cord provides the cord extension/contraction part which is folded from the terminal position of the parallel-to-board part and leads to a cord insertion hole in the connector; and the covering member covers a portion between the soldered part and the terminal position of the parallel-to-board part.

According to this configuration, an initial crease can be formed on the other end side of the microphone cord by the covering member, and also the crease can be made reliable.

Also, according to a preferred mode of the present invention, the covering member is formed with a guide groove for positioning the terminal position of the parallel-to-board part on one end surface side of the circuit board.

According to this configuration, the cord extension/contraction part can be bent at a gentle angle along the board surface of the circuit board.

Also, according to a preferred mode of the present invention, the film cover is provided with a main surface part which covers a predetermined range of one surface of the circuit board including the soldered part in which the microphone cord is soldered to the electrode terminal; first and second flap pieces connectingly provided at both left and right ends of the main surface part and foldable along the other side of the circuit board; and a third flap piece connectingly provided at one end on the electrode terminal side of the main surface part and foldable along the other side of the circuit board, the first to third flap pieces being fixed to each other on the other surface side of the circuit board with an adhesive tape.

According to this configuration, the cover film can be attached surely to the circuit board.

Further, according to a preferred mode of the present invention, a feeding transformer for the condenser microphone unit is mounted on the circuit board, and at the other end of the main surface part of the cover film, a fourth flap piece for covering at least a part of the feeding transformer is connectingly provided.

According to this configuration, the positional deviation of the cover film with respect to the circuit board can be prevented surely, so that the reliability of cover film can be enhanced more.

DETAILED DESCRIPTION

Figure 1:
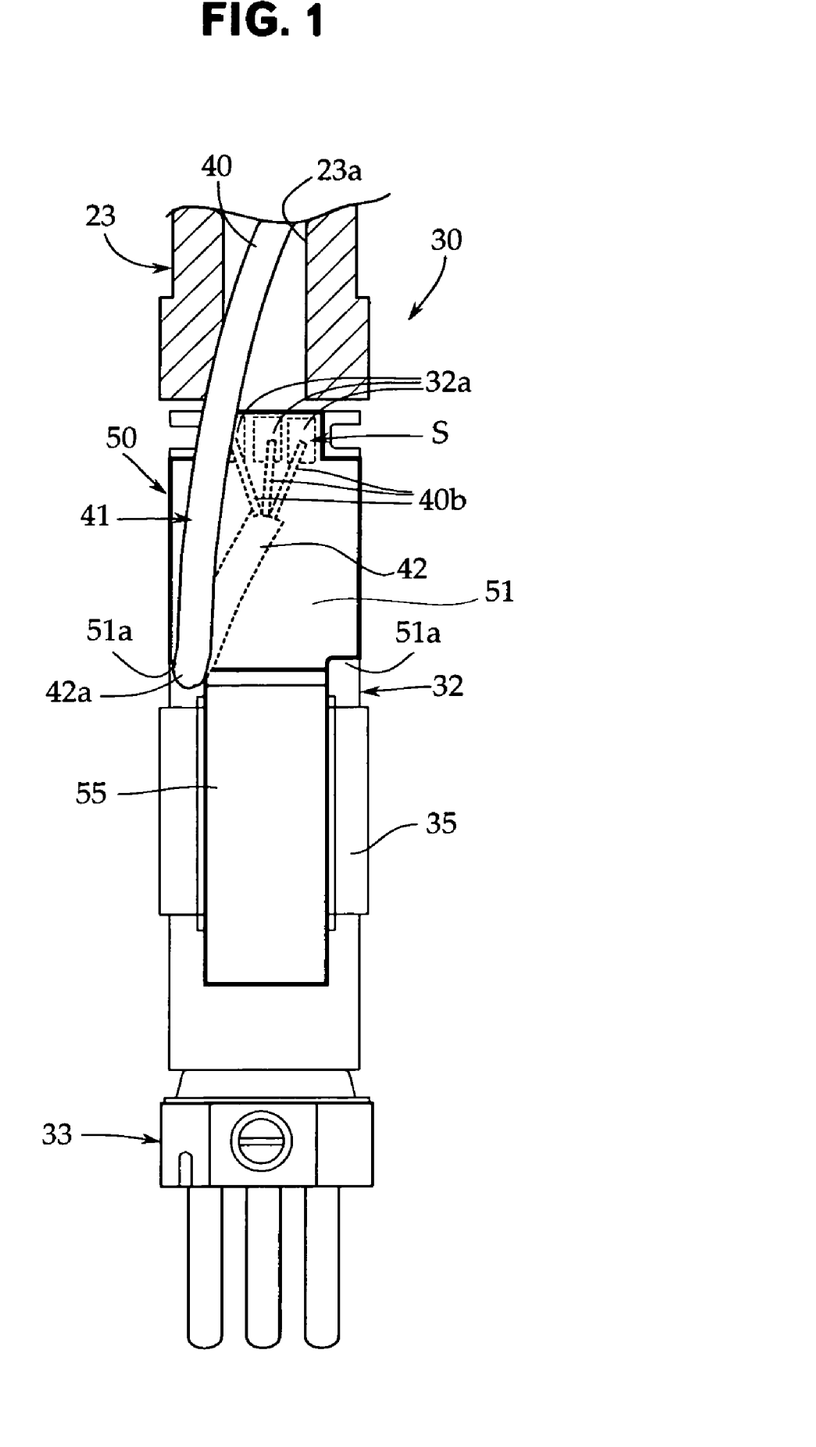
FIG. 1 is an enlarged plan view of an output module section, which is an essential portion of the present invention.

An embodiment of the present invention will now be described with reference to FIGS. 1 to 4. FIG. 1 is an enlarged plan view of an output module section, which is an essential portion of the present invention, FIG. 2 is a left side view of FIG. 1, FIG. 3 is a back view of FIG. 1, and FIG. 4A is a development view of a cover film (covering member) applied to a circuit board in the output module section, FIG. 4B is a plan view showing a state in which the cover film is folded, and FIG. 4C is a left side view of the folded cover film.

Figure 2:
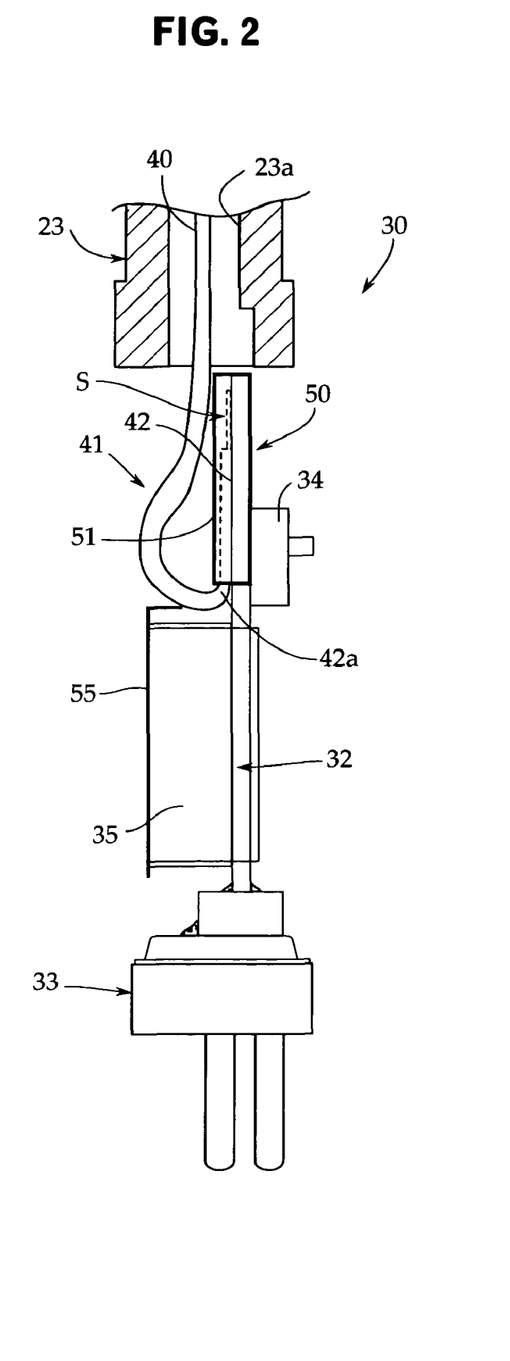
FIG. 2 is a left side view of FIG. 1.
Figure 3:
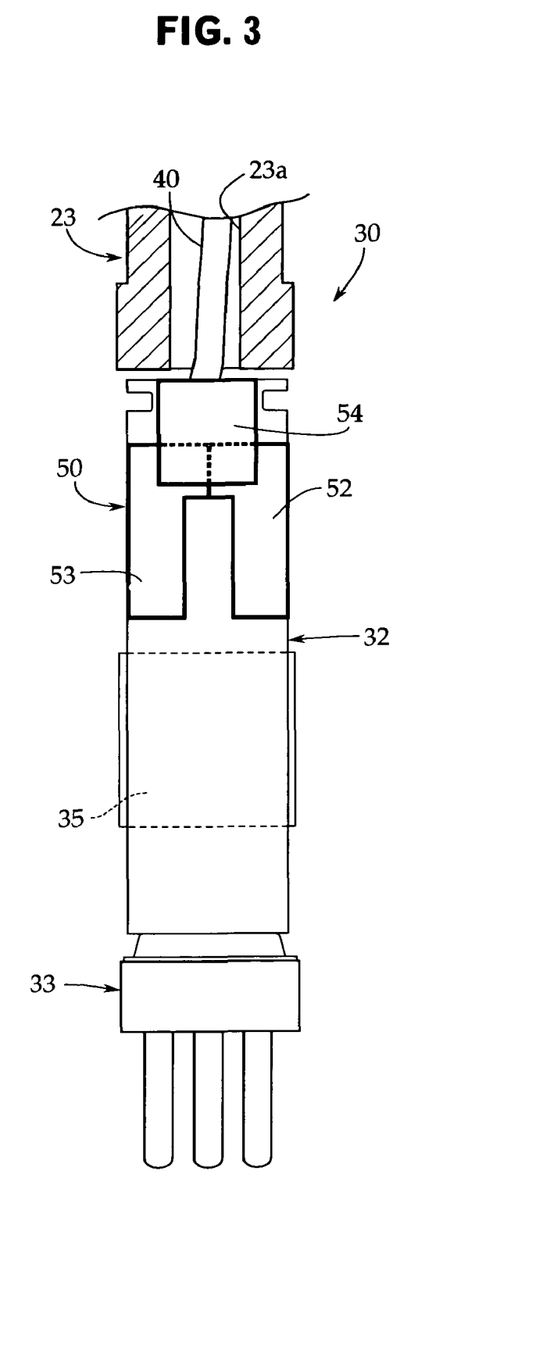
FIG. 3 is a back view of FIG. 1.
Figure 4A:
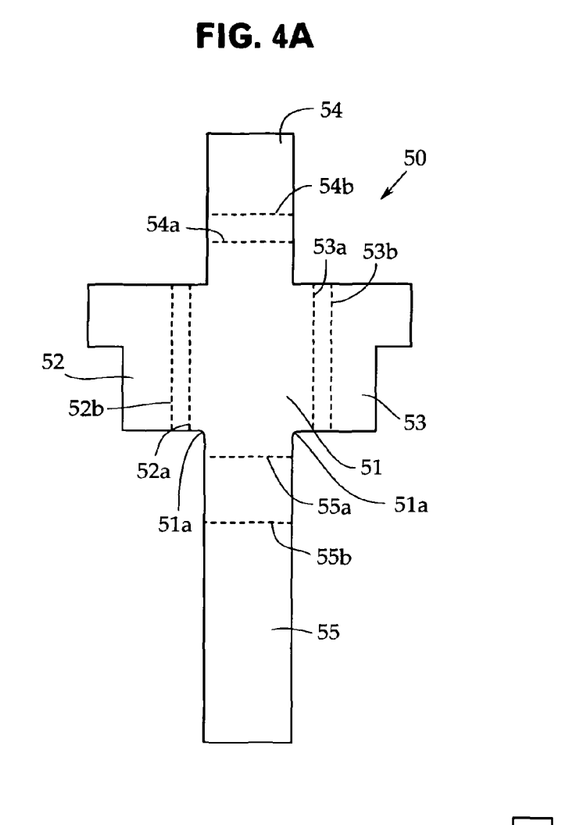
FIG. 4A is a development view of a cover film.
Figure 4B:
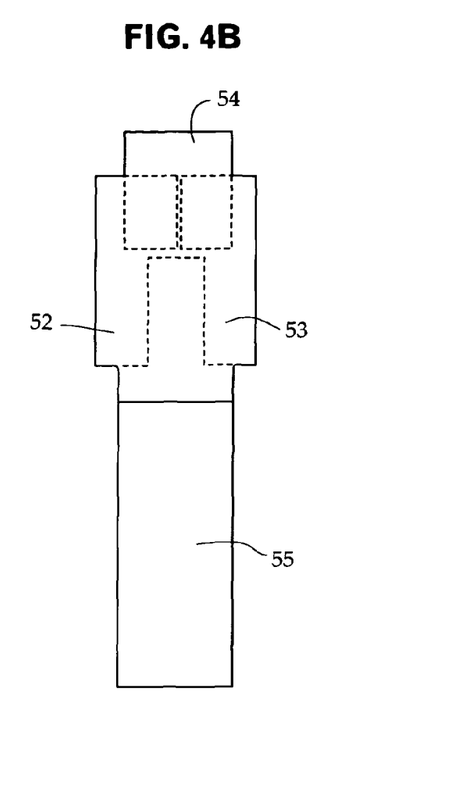
FIG. 4B is a plan view showing a state in which the cover film is folded.
Figure 4C:
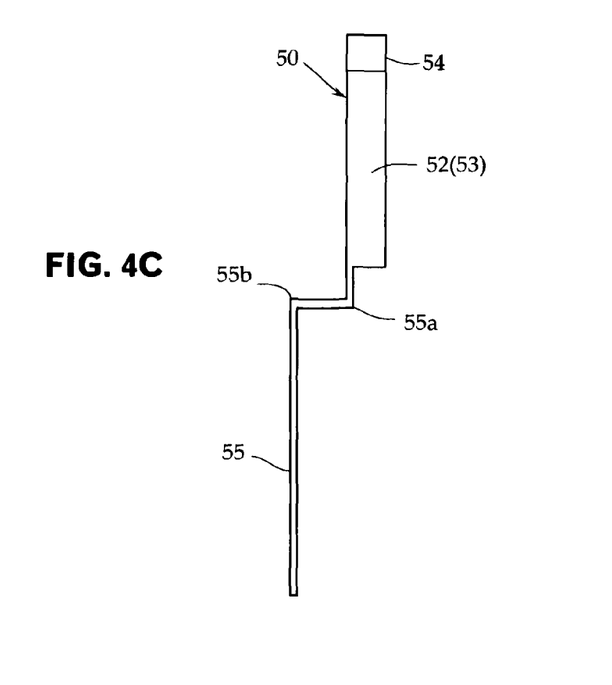
FIG. 4C is a left side view of the folded cover film.

Although a support pipe is not shown in FIGS. 1 to 3, the gooseneck microphone in accordance with the present invention is also of an adjustable gooseneck type. Specifically, like the conventional example explained with reference to FIGS. 5 and 6, this gooseneck microphone has a support pipe 20 including a flexible pipe 21 and a telescopic pipe 22, and a condenser microphone unit is supported at the tip end of the support pipe 20. Regarding to the support pipe 20, FIGS. 5A and 5B should be referred to appropriately.

Also, in FIGS. 1 to 3, only the internal construction of output module section is shown, and a shield case is omitted. The shield case may have the same configuration as that of the shield case 31 provided in the aforementioned conventional example. Besides, the same reference numerals are applied to elements that are the same or that are regarded as the same as those in the aforementioned conventional example.

As shown in FIGS. 1 to 3, a circuit board 32 and an output connector 33 are provided in an output module section 30. On the circuit board 32, an audio output circuit (not shown) including a low-cut filter circuit and an amplifier circuit, which are necessary for the function of microphone, is provided. Further explaining a portion shown in the figures, electrical parts such as a microphone switch 34 and a feeding transformer 35 are mounted.

The output connector 33 is a three-pin output connector specified in EIAJ-RC5236 "Audio latch lock round type connector", and is arranged at the rear end of the circuit board 32 as in the aforementioned conventional example.

In FIGS. 1 to 3, a connector 23 for connecting the support pipe 20 to the output module section 30 and the circuit board 32 are shown so as to be separated from each other. In this embodiment, however, one end side of the circuit board 32 is integrally connected to the connector 23 by soldering or screwing.

As shown in FIG. 1, at one end on the connector 23 side of the circuit board 32, electrode terminals 32a including solder pads corresponding to grounding, and hot and cold of signal are formed. To each of the electrode terminals 32a, the other end 40b of a microphone cord 40 extending from the condenser microphone unit 10 side is soldered. In FIGS. 1 and 2, reference symbol S is applied to this soldered part.

In the present invention as well, a cord extension/contraction part 41 that extends and contracts along with the extension and contraction of the support pipe 20 is provided in the output module section 30. As in the aforementioned conventional example, to provide the cord extension/contraction part 41, the circuit board 32 is exposed in advance by shifting the shield case 31 to the support pipe 20 side, and the microphone cord 40 is pulled out onto the circuit board 32 through a cord insertion hole 23a in the connector 23 in the state in which the support pipe 20 is extended to the maximum length (refer to FIG. 5A), and is cut to an appropriate length.

Precautionary measures are taken to prevent excessive stress (force in the direction such as to break the soldered part) from being applied to the soldered part S especially when the microphone cord 40 is contracted. Also, the other end 40b side of the microphone cord 40 is folded through 180 degrees and is soldered to the electrode terminal 32a so that initial creases are formed easily.

Thereby, as shown in FIG. 5B, when the support pipe 20 is contracted, a cord excess part corresponding to the contracted part is stored in the output module section 30 as the cord extension/contraction part 41 while being curled into a zigzag shape.

The microphone cord 40 of the cord extension/contraction part 41 goes into and out of the output module section 30 through the cord insertion hole 23a in the connector 23 along with the extension and contraction of the support pipe 20. Since the electrode terminals 32a of the circuit board 32 are arranged close to the connector 23 side, the soldered part S is rubbed by the microphone cord 40 going in and out, and if the rubbing is repeated, the soldering part S may be broken.

To prevent the breakage of soldering part, in the present invention, a covering member that covers at least the soldered part S is provided. In this embodiment, a cover film 50 formed of a low-friction synthetic resin (for example, polyethylene terephthalate) is used as the covering member.

As shown in the development view of FIG. 4A, the cover film 50 is provided with a main surface part 51 that covers a predetermined range of one surface of the circuit board 32 including the soldered part S, first and second flap pieces 52 and 53 connectingly provided at both left and right ends of the main surface part 51, a third flap piece 54 connectingly provided at one end on the soldered covering side of the main surface part 51, and a fourth flap piece 55 connectingly provided on the other end side of the main surface part 51.

The first and second flap pieces 52 and 53 can be folded along the other surface side of the circuit board 32 via two respective mountain fold lines 52a, 53a and 52b, 53b. Also, the third flap piece 54 can be folded along the other surface side of the circuit board 32 via two mountain fold lines 54a and 54b. FIG. 4B shows the state in which the first to third flap pieces 52 to 54 are folded to the other surface side of the circuit board 32.

In contrast, the fourth flap piece 55 is bend substantially into an L shape as shown in FIG. 4C via a valley fold line 55a and a mountain fold line 55b so as to cover the feeding transformer 35 mounted on the circuit board 32.

The cover film 50 is arranged in the state in which the other end 40b of the microphone cord 40 is developed on one surface of the circuit board 32 having been soldered to the electrode terminals 32a, and is attached to the circuit board 32 by folding the first to third flap pieces 52 to 54 to the other surface side of the circuit board 32, and by joining the lapped portions of the flap pieces 52 to 54 shown in FIG. 3 with an adhesive (pressure-sensitive) tape, not shown.

To enable the cover film 50 to be attached to the circuit board 32 without looseness, it is preferable that at least the spaces between the mountain fold lines 52a, 53a and 52b, 53b be approximately equal to the thickness of the circuit board 32.

Thereby, a part on the other end 40b side of the microphone cord 40, that is, a part extending to the opposite side to the connector 23 through a predetermined distance from the soldered part S in which the other ends 40b are soldered to the electrode terminals 32a is pressed by the main surface part 51 of the cover film 50 as a parallel-to-board part 42, and a part ranging from a terminal position 42a of the parallel-to-board part 42 to the cord insertion hole 23a in the connector 23 is the actual cord extension/contraction part 41.

Also, to enable the cord extension/contraction part 41 to be bent (curled) at a gentle angle along the board surface of the circuit board 32, it is preferable that the terminal position 42a of the parallel-to-board part 42 be positioned on either one end surface side of the circuit board 32 as shown in FIG. 1.

Thereupon, in this embodiment, to surely position the terminal position 42a of the parallel-to-board part 42 on the end surface side of the circuit board 32, a guide groove 51a is formed in the root part of the fourth flap piece 55 of the main surface part 51.

As described above, after the other end 40b of the microphone cord 40 has been connected to the circuit board 32, and the cover film 50 has been attached to the circuit board 32, finally the shield case 31 is returned from the support pipe 20 side to cover the circuit board 32 and the output connector 33, and thereafter the shield case 31 is screwed to the connector 23.

In this case, since the cover film 50 is attached to the circuit board 32, and the fourth flap piece 55 is arranged on the upper surface of the feeding transformer 35, the shield case 31 can be put on the circuit board 32 from the support pipe 20 side. Also, since the fourth flap piece 55 is present, the positional deviation of the cover film 50 with respect to the circuit board 32 can be prevented surely.

The above is an explanation of the present invention given based on the example shown in the figures. However, the present invention is not limited to this example. For example, the configuration may be such that only the soldered part S in which the other ends 40b of the microphone cord 40 are soldered to the electrode terminals 32a is covered by the covering member. In this case, as the covering member, a coating substance of resin liquid, not the film, may be used.

The present application is based on, and claims priority from, Japanese Application Serial Number JP2007-123163, filed May 8, 2007, the disclosure of which is hereby incorporated by reference herein in its entirety.

The invention claimed is:

1. A gooseneck microphone comprising:
a condenser microphone unit;
a support pipe which includes a telescopic pipe and a bendable flexible pipe and supports the condenser microphone unit on an upper end side thereof;
an output module section which has a cylindrical shield case incorporating a circuit board including an audio output circuit and is connected with a lower end of the support pipe via a connector an upper end thereof;
a microphone cord which is inserted in the support pipe, one end side thereof being connected to the condenser microphone unit and the other end side thereof being pulled out into the output module section through the connector and being soldered at a soldered part to a predetermined electrode terminal disposed on one surface of the circuit board;
a cord extension/contraction part which extends and contracts along with an extension and contraction of the support pipe and provided on the other end side of the microphone cord in the output module section, the cord extension/contraction part being disposed above the soldered part and moving above the soldered part upon the extension and contraction of the support pipe; and
a covering member which is disposed between the cord extension/contraction part and the soldered part and covers at least the soldered part to prevent direct contact of the extension/contraction part with the soldered part, the covering member being a cover film formed of a low-friction synthetic resin material.

2. A gooseneck microphone comprising:
a support pipe which includes a telescopic pipe and a bendable flexible pipe and supports a condenser microphone unit on an upper end side thereof;
an output module section which has a cylindrical shield case incorporating a circuit board including an audio output circuit and is connected with a lower end of the support pipe via a connector at an upper end thereof;
a microphone cord which is inserted in the support pipe, one end thereof being connected to the condenser microphone unit and the other end thereof being pulled out into the output module section through the connector and being soldered to a predetermined electrode terminal existing on one surface of the circuit board; and
a cord extension/contraction part which extends and contracts along with an extension and contraction of the support pipe being provided on another end side of the microphone cord in the output module section;
wherein the circuit board is provided with a covering member which covers at least a soldered part in which the microphone cord is soldered to the electrode terminal; the electrode terminal is arranged on one end side on a connector side of the circuit board; a part on the other end side of the microphone cord is a parallel-to-board part which extends at an opposite side to the connector for a predetermined distance from the soldered part toward another end side of the circuit board along one surface of the circuit board, and a remaining part of the microphone cord provides the cord extension/contraction part which is folded from a terminal position of the parallel-to-board part and leads to a cord insertion hole in the connector; and the covering member covers a portion between the soldered part and the terminal position of the parallel-to-board part.

3. A gooseneck microphone comprising:
a support pipe which includes a telescopic pipe and a bendable flexible pipe and supports a condenser microphone unit on an upper end side thereof;
an output module section which has a cylindrical shield case incorporating a circuit board including an audio output circuit and is connected with a lower end of the support pipe via a connector at an upper end thereof;
a microphone cord which is inserted in the support pipe, one end thereof being connected to the condenser microphone unit and the other end thereof being pulled out into the output module section through the connector and being soldered to a predetermined electrode terminal existing on one surface of the circuit board; and
a cord extension/contraction part which extends and contracts along with an extension and contraction of the support pipe being provided on another end side of the microphone cord in the output module section;
wherein the circuit board is provided with a covering member which covers at least a soldered part in which the microphone cord is soldered to the electrode terminal; and the covering member is formed with a guide groove for positioning a terminal position of a parallel-to-board part on one end surface side of the circuit board.

4. The microphone according to claim 1, wherein the cover film is provided with a main surface part which covers a predetermined range of one surface of the circuit board including the soldered part in which the microphone cord is soldered to the electrode terminal; first and second flap pieces are connectingly provided at both left and right ends of the main surface part and foldable along the other side of the circuit board; and a third flap piece is connectingly provided at one end on the electrode terminal side of the main surface part and foldable along the other side of the circuit board, the first to third flap pieces being fixed to each other on the other surface side of the circuit board with an adhesive tape.

5. The microphone according to claim 4, wherein a feeding transformer for the condenser microphone unit is mounted on the circuit board, and at one end of a main surface part of the cover film, a fourth flap piece for covering at least a part of the feeding transformer is connectingly provided.

6. The microphone according to claim 1, wherein the microphone cord in the output module section has a parallel-to-board part downwardly extended from the soldered part and the cord extension/contraction part upwardly folded at a terminal of the parallel-to-board part so that the extension/contraction part contacts with the soldered part through the covering member.

* * * * *